(12) United States Patent
Oh et al.

(10) Patent No.: US 11,476,400 B2
(45) Date of Patent: Oct. 18, 2022

(54) VENTILATION MODULE FOR VENTILATION SEAT

(71) Applicants: Hyundai Motor Company, Seoul (KR); Kia Motors Corporation, Seoul (KR)

(72) Inventors: Man Ju Oh, Yongin-si (KR); Sang Shin Lee, Suwon-si (KR); Jae Woo Park, Ansan-si (KR); So Yoon Park, Suwon-si (KR); Jae Woong Kim, Hwaseong-si (KR); So La Chung, Seoul (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 850 days.

(21) Appl. No.: 16/385,228

(22) Filed: Apr. 16, 2019

(65) Prior Publication Data

US 2019/0245131 A1 Aug. 8, 2019

Related U.S. Application Data

(62) Division of application No. 15/607,627, filed on May 29, 2017, now abandoned.

(30) Foreign Application Priority Data

Nov. 22, 2016 (KR) ........................ 10-2016-0155893

(51) Int. Cl.
*H01L 35/30* (2006.01)
*B60N 2/56* (2006.01)
*F25B 21/02* (2006.01)
*H01L 35/28* (2006.01)

(52) U.S. Cl.
CPC ............ *H01L 35/30* (2013.01); *B60N 2/5635* (2013.01); *B60N 2/5642* (2013.01);
(Continued)

(58) Field of Classification Search
CPC ....... H01L 35/30; H01L 35/28; B60N 2/5635; B60N 2/5642; B60N 2/5657;
(Continued)

(56) References Cited

U.S. PATENT DOCUMENTS 6,213,198 B1 * 4/2001 Shikata ................ B60H 1/3207
62/3.61
2007/0209369 A1 9/2007 Ito et al.
(Continued)

FOREIGN PATENT DOCUMENTS

CN 102019865 A 4/2011
JP H11294891 A 10/1999
(Continued)

*Primary Examiner* — Emmanuel E Duke
(74) *Attorney, Agent, or Firm* — Slater Matsil, LLP

(57) ABSTRACT

A ventilation module can be used with a ventilation seat for a vehicle. A thermoelectric air-conditioning part has a thermoelectric unit performing heat absorption and heat generation by using a Peltier effect when electric power is applied, a cooling unit provided at a first side of the thermoelectric unit, and a heat dissipation unit provided at a second side of the thermoelectric unit. The module is configured so that air that is supplied from a blower is cooled by the thermoelectric air-conditioning part, passes through a cooling fin of the cooling unit, and is discharged to an interior of the vehicle through a seat cushion. The module is configured so that air that is supplied from the blower is heated by the thermoelectric air-conditioning part, passes through a heat dissipating fin of the heat dissipation unit, and is discharged through the heat dissipation path.

20 Claims, 7 Drawing Sheets

(52) U.S. Cl.
CPC ......... *B60N 2/5657* (2013.01); *B60N 2/5685* (2013.01); *B60N 2/5692* (2013.01); *F25B 21/02* (2013.01); *F25B 2321/0251* (2013.01); *H01L 35/28* (2013.01)

(58) Field of Classification Search
CPC .. B60N 2/5685; B60N 2/5692; B60N 2/5621; B60N 2/5678; F25B 21/02; F25B 2321/0251; F25B 2321/02
See application file for complete search history.

(56) References Cited

U.S. PATENT DOCUMENTS

| | | | | |
|---|---|---|---|---|
| 2007/0234742 | A1* | 10/2007 | Aoki | B60H 1/00285 62/3.3 |
| 2009/0193814 | A1* | 8/2009 | Lofy | B60N 2/5657 62/3.61 |
| 2011/0061401 | A1* | 3/2011 | Jun | B60N 2/5692 165/104.34 |
| 2013/0119717 | A1* | 5/2013 | Gong | B60N 2/56 297/180.12 |

FOREIGN PATENT DOCUMENTS

| | | | |
|---|---|---|---|
| JP | 2002013836 | A | 1/2002 |
| JP | 2004338701 | A * | 12/2004 |
| JP | 2004338701 | A * | 12/2004 |
| JP | 2004338701 | A | 12/2004 |
| KR | 200380280 | Y1 | 3/2005 |
| KR | 20130056499 | A1 | 5/2013 |
| KR | 101524089 | B1 | 5/2015 |

* cited by examiner

VENTILATION MODULE FOR VENTILATION SEAT

CROSS-REFERENCE TO RELATED APPLICATIONS

This application is a divisional of U.S. patent application Ser. No. 15/607,627, filed on May 29, 2017, which claims priority to Korean Patent Application No. 10-2016-0155893, filed on Nov. 22, 2016, which applications are hereby incorporated by reference herein in their entirety.

TECHNICAL FIELD

The present invention relates generally to a ventilation module for a ventilation seat.

BACKGROUND

In general, a vehicle seat has a seat cushion that plays a role of providing a comfortable seating feeling to a user. In recent years, there has been a trend that in addition to the basic functionality of vehicle parts, various kinds of convenience devices are being provided in parts such as the vehicle seat. Among these convenience devices for a vehicle seat, a seat heater provided with a heating wire for providing warmth during winter operation is widely employed. Such a seat heater is applied to a large number of vehicles because there is no difficulty in terms of design and installation. However, when such a heating wire is used, there is a limit to uniformly distributing warmth to a user.

In an effort to solve this problem, a method in which a cooler is provided on the vehicle seat and a thermoelectric device (TED) is mounted on the cooler to supply heated air to the vehicle seat has been developed. However, when air is heated by using the thermoelectric device, there is a problem in that an anti-overheating device is required to prevent damage to the vehicle seat due to overheating.

In addition, when the thermoelectric device is used, airflow that will be discarded due to the characteristics of thermoelectric device occurs, and airflow is reduced due to the vehicle seat causing airflow resistance whereby a temperature difference in an outlet structure is increased. Accordingly, the amount of heat dissipation for cooling a user is reduced, thereby resulting in performance degradation. Moreover, since air velocity is lowered and the temperature difference is increased, there is a disadvantage in that a large amount of condensation water is generated, and the amount of loss of air is increased.

The foregoing is intended merely to aid in the understanding of the background of the present invention, and is not intended to mean that the present invention falls within the purview of the related art that is already known to those skilled in the art.

SUMMARY

The present invention relates generally to a ventilation module for a ventilation seat. In embodiments, the module is installed in a vehicle seat and is configured to discharge air to an interior of a vehicle through a blower, thereby being capable of allowing more air to be supplied to a user.

Accordingly, the present invention has been made keeping in mind the above problems occurring in the related art, and the present invention is intended to propose a ventilation module for a ventilation seat, the module being capable of increasing the amount of heat dissipation to improve performance of the module, and of efficiently removing condensation water in the module.

According to one aspect of the present invention, a ventilation module for a ventilation seat is provided. The ventilation module is provided in a vehicle seat and is configured to discharge air to an interior of a vehicle through a blower. The module includes a thermoelectric air-conditioning part including a thermoelectric unit performing heat absorption and heat generation by using a Peltier effect when electric power is applied. A cooling unit is provided at a first side of the thermoelectric unit, and a heat dissipation unit is provided at a second side of the thermoelectric unit. A cool air duct in which the cooling unit is placed, and through which air that is supplied from the blower, is cooled by the thermoelectric air-conditioning part, and passes through a cooling fin of the cooling unit, is discharged to the interior of the vehicle through a seat cushion. A heat dissipation path in which the heat dissipation unit is placed, and through which air that is supplied from the blower, is heated by the thermoelectric air-conditioning part, and passes through a heat dissipating fin of the heat dissipation unit, is discharged. By increasing a resistance to airflow in the heat dissipation unit more than that in the cooling unit, an amount of airflow flowing to the cooling unit is increased more than that flowing to the heat dissipation unit.

An area in which the heat dissipating fin is installed may be larger than that in which the cooling fin is installed, so that the resistance to airflow in the heat dissipation unit is increased and thus the amount of airflow in the cooling unit is increased.

The heat dissipation fin may be provided in a zigzag shape by being bent a predetermined number of times, so that the resistance to airflow in the heat dissipation unit is increased and thus the amount of airflow in the cooling unit is increased.

The heat dissipating fin combined with the heat dissipation unit of the thermoelectric air-conditioning part may be provided by being stacked in one or more layers, so that air introduced to the heat dissipation unit passes through one layer and then passes through a remaining layer, whereby the resistance to airflow in the heat dissipation unit is increased and thus the amount of airflow in the cooling unit is increased.

The cooling fin of the cooling unit may be provided by being bent a plurality of times in a streamlined-shape such that the cooling unit has a wave-shaped path in which air flows from an inlet to an outlet.

A lateral cross-section of the cooling fin may be formed such that a first side thereof is higher than a second side thereof so as to correspond to a shape of the cool air duct.

The thermoelectric air-conditioning part may be provided with a moisture absorbing material, the moisture absorbing material absorbing condensation water of the cooling unit.

The moisture absorbing material may be provided at the cooling unit and the heat dissipation unit and may connect the cooling unit and the heat dissipation unit, such that condensation water of the cooling unit is absorbed and moved to the heat dissipation unit by the moisture absorbing material, thereby increasing a cooling effect for the heat dissipation unit, and the condensation water moved to the heat dissipation unit is evaporated, thereby obtaining a cooling effect of evaporation heat.

According to the ventilation module for the ventilation seat with the above-described configuration, a cooling efficiency equation is used in which the temperature difference between the cooling unit and the heat dissipation unit is increased by further providing a heat pipe and the moisture absorbing material, the area of the heat dissipation unit is larger than that of the cooling unit, and the resistance to airflow flowing to the heat dissipation unit is increased so that the amount of airflow flowing to the cooling unit is increased more than that flowing to the heat dissipation unit 230. Thus, the amount of heat dissipation is increased, whereby more pleasant cooling air can be provided to a user.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF ILLUSTRATIVE EMBODIMENTS

Figure 1:
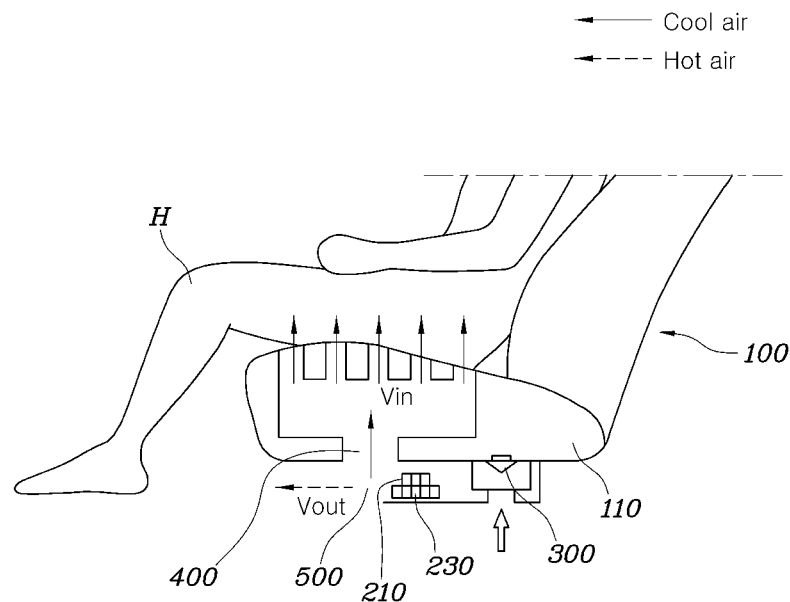
FIG. 1 is a view showing a seat mounted with a ventilation module for a ventilation seat according to the present invention.

Hereinbelow, exemplary embodiments of the present invention will be described in detail with reference to the accompanying drawings. Throughout the drawings, the same reference numerals will refer to the same or like parts.

Figure 2:
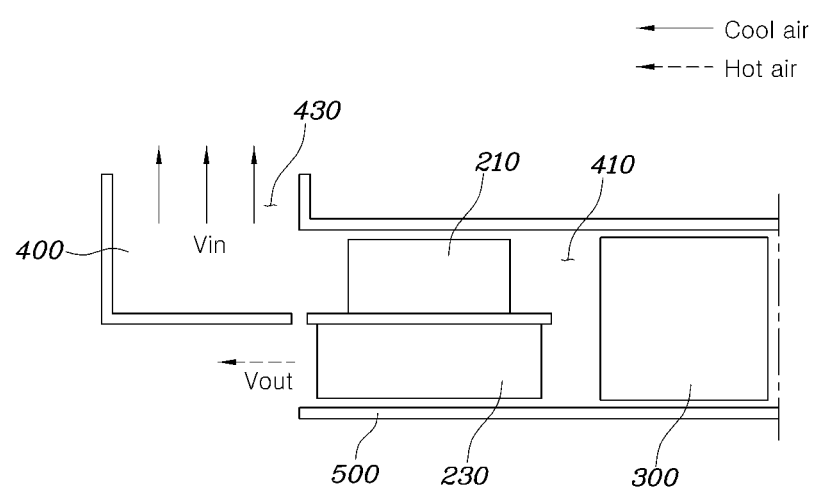
FIG. 2 is a view specifically showing the ventilation module.

FIG. 1 is a view showing a seat mounted with a ventilation module for a ventilation seat according to the present invention, FIG. 2 is a view specifically showing the ventilation module, FIGS. 3 to 6 are views showing first to fourth embodiments of FIG. 2, and FIGS. 7 to 11 are views showing embodiments in which a moisture absorbing material is further provided to FIG. 2.

The ventilation module for the ventilation seat according to the preferred embodiment of the present invention is installed in a vehicle seat 100 and configured to discharge air to an interior of a vehicle through a blower 300, the module including: a thermoelectric air-conditioning part 200 provided with a thermoelectric unit 250 performing heat absorption and heat generation by using a Peltier effect when electric power is applied, a cooling unit 210 provided at a first side of the thermoelectric unit 250, and a heat dissipation unit 230 provided at a second side of the thermoelectric unit 250; a cool air duct 400 in which the cooling unit 210 is placed, and through which air that is supplied from the blower 300, is cooled by the thermoelectric air-conditioning part 200, and passes through a cooling fin 211 of the cooling unit 210, is discharged to an interior of the vehicle through a seat cushion 110; and a heat dissipation path 500 in which the heat dissipation unit 230 is placed, and through which air that is supplied from the blower 300, is heated by the thermoelectric air-conditioning part 200, and passes through a heat dissipating fin 231 of the heat dissipation unit 230, is discharged, wherein by increasing a resistance to airflow in the heat dissipation unit 230 more than that in the cooling unit 210, the amount of air flowing to the cooling unit 210 is increased more than the heat dissipation unit 230. Since the above Peltier effect is a known technique, a detailed description thereof will be omitted.

In other words, the present invention relates to the vehicle seat 100 and, more particularly, to the ventilation module for the ventilation seat provided under the seat cushion 110 and supplying cool air to a user H, wherein air sucked by the blower 300 is cooled or heated by heat absorbed or generated by the Peltier effect at the thermoelectric unit 250, whereafter cooling air is supplied to the user H through the cold-air duct 400 and heated air is discharged through the heat dissipation path 500. Here, in the present invention, the resistance to airflow in the heat dissipation unit 230 is increased more than that in the cooling unit 210, whereby the amount of airflow flowing to the cooling unit 210 can be increased more than that flowing to the heat dissipation unit 230.

Since a cooling effect for the thermoelectric air-conditioning part 200 increases in proportion to a temperature difference, an inflow velocity of air, and an area ($Qc=\Delta T \times Vin \times A$, where Qc is the amount of heat dissipation, T is temperature, Vin is an inflow velocity, and A is an area), the thermoelectric air-conditioning part 200 has a structure in which an area A and a resistance to airflow of the heat dissipation unit 230 are increased, and the inflow velocity Vin flowing to the cooling unit 210 is increased, whereby the amount of heat dissipation Qc is increased.

Embodiments of the present invention will now be described in more detail with reference to the drawings.

First, a first embodiment of the thermoelectric air-conditioning part 200 will be described with reference to FIG. 3.

Figure 3:
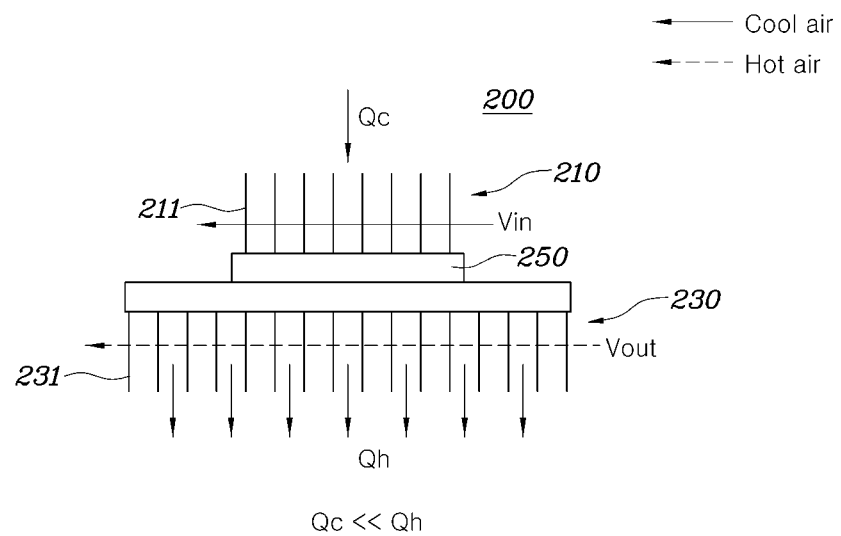
FIGS. 3 to 6 are views showing first to fourth embodiments of FIG. 2.

As shown in FIG. 3, the thermoelectric air-conditioning part 200 includes the cooling unit 210 at the first side thereof and the heat dissipation unit 230 at the second side thereof with the thermoelectric unit 250 interposed therebetween. An area in which the heat dissipating fins 231 of the heat dissipation unit 230 are installed is larger than an area in which the cooling fins 211 of the cooling unit 210 are installed, and the number of the heat dissipating fins 231 is larger than that of the cooling fins 211, whereby when air introduced from the blower 300 passes through the cooling fins 211 and the heat dissipating fins 231, the heat dissipating fins 231 act as a resistor and thus the resistance to airflow in the heat dissipation unit 230 is increased. Accordingly, the amount of airflow flowing to the cooling unit 210 is increased more than that flowing to the heat dissipation unit 230. Thus, in the first embodiment, by increasing both the area and the resistance to airflow of the heat dissipation unit 230, the cooling effect is increased in such a manner that more cooling air can be provided to the user H.

Figure 4:
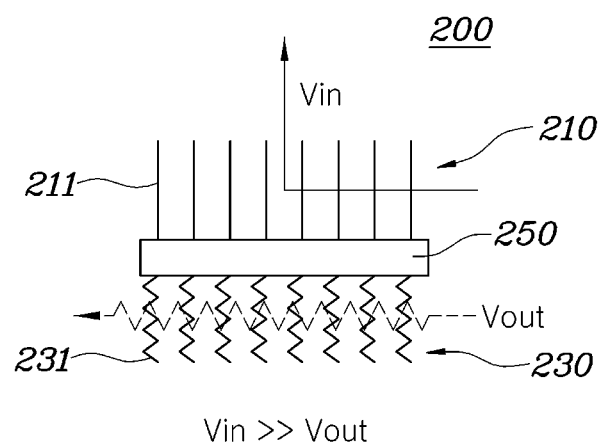

FIG. 4 shows a second embodiment of the thermoelectric air-conditioning part 200 according to the present invention. As shown in the drawing, the heat dissipating fins 231 of the heat dissipation unit 230 are provided in a zigzag shape by being bent a predetermined number of times. Accordingly, even if the cooling unit 210 and the heat dissipation unit 230 have the same area, the resistance to airflow introduced through the blower 300 is increased in the heat dissipation unit 230 by the heat dissipating fins 231. Thus, the amount of airflow in the cooling unit 210 is increased so that more cooling air can be provided to the user H.

Figure 5:
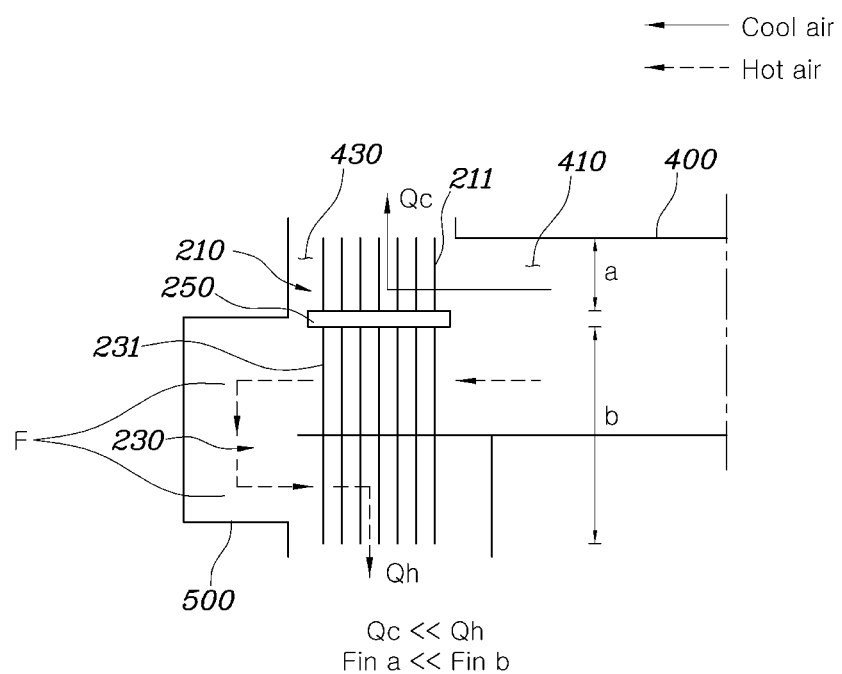

FIG. 5 shows a third embodiment of the thermoelectric air conditioning unit 200 of the present invention. As shown in the drawing, the heat dissipating fins 231 combined with the heat dissipation unit 230 of the thermoelectric air-conditioning part 200 are provided to be stacked in one or more layers F. Accordingly, air introduced to the heat dissipation unit 230 passes through one layer F formed by the heat dissipating fins 231 and then passes through a remaining layer F, whereby the resistance to airflow introduced through the blower 300 is increased in the heat dissipation unit 230 in such a manner that the amount of airflow in the cooling unit 210 is increased and thus more cooling air can be provided to the user H. In particular, a total length b in which the heat dissipating fins 231 are installed may be set to be 1.5 times longer than a total length a in which the cooling fins 211 are installed.

Figure 6:
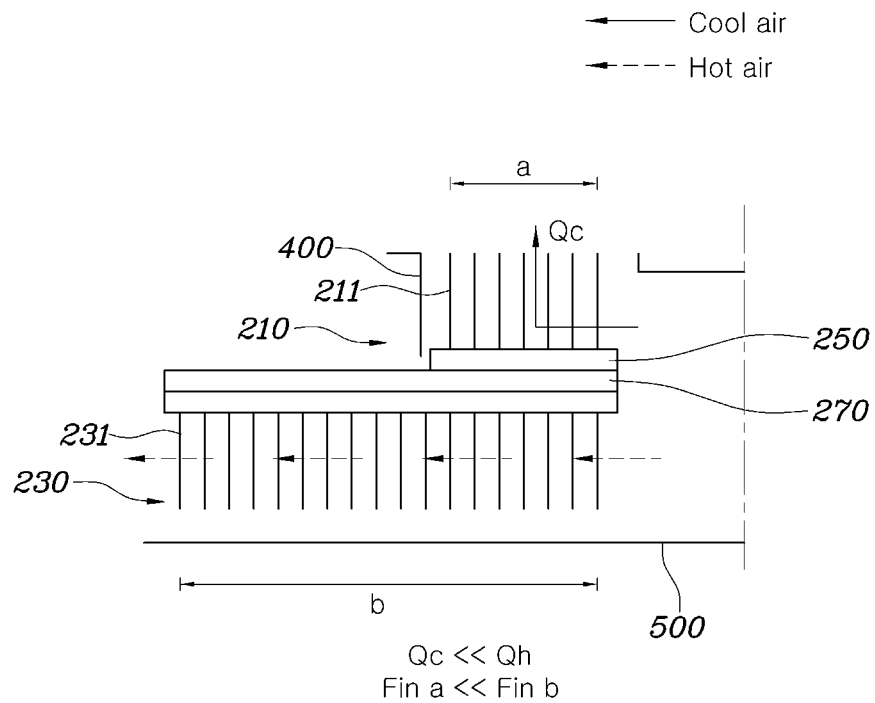

FIG. 6 shows a fourth embodiment of the thermoelectric air-conditioning part 200 of the present invention, and is configured similarly to the first embodiment shown in FIG. 3. However, in the case of the fourth embodiment, a heat pipe 270 is further provided. The heat pipe 270 functions to assist cooling performance of the cooling unit 210. In other words, the heat pipe 270 is provided at a location between the cooling unit 210 and the heat dissipation unit 230 to enable heat exchange therebetween. Accordingly, the area in which the heat dissipating fins 231 of the heat dissipation unit 230 are installed is larger than the area in which the cooling fins 211 of the cooling unit 210 are installed, the number of the heat dissipating fins 231 is larger than that of the cooling fins 211, and the heat pipe 270 is installed at a portion where the heat dissipating fins 231 are provided, whereby when air introduced through the blower 300 passes the thermoelectric air-conditioning part 200, the heat dissipating fins 231 act as a resistor and thus the resistance to airflow in the heat dissipation unit 230 can be increased, the heat pipe 270 increases heat exchange performance between the cooling unit 210 and the heat dissipation unit 230, and thus a cooling efficiency can be increased. Thus, by increasing both the area and the resistance to airflow of the heat dissipation unit 230 while the amount of air flowing to the cooling unit 210 is increased more than that flowing to the heat dissipation unit 230, the cooling effect can be increased in such a manner that more cooling air can be provided to the user H.

Further, as shown in FIGS. 7 to 11, the thermoelectric air-conditioning part 200 is provided with a moisture absorbing material 600, such that condensation water in the cooling unit 210 is absorbed by the moisture absorbing material 600. Accordingly, condensation water is prevented from being formed in the cooling fins 211 to prevent deterioration in cooling efficiency. Then, the absorbed condensation water is moved to the heat dissipation unit 230 by the moisture absorbing material, thereby increasing the cooling effect for the heat dissipation unit 230, and condensation water moved to the heat dissipation unit 230 is evaporated, thereby achieving a cooling effect of evaporation. Although the moisture absorbing material 600 is provided at the thermoelectric air-conditioning part 200 in FIGS. 7 to 11, the moisture absorbing material 600 may be provided to the first to fourth embodiments.

Figure 7:
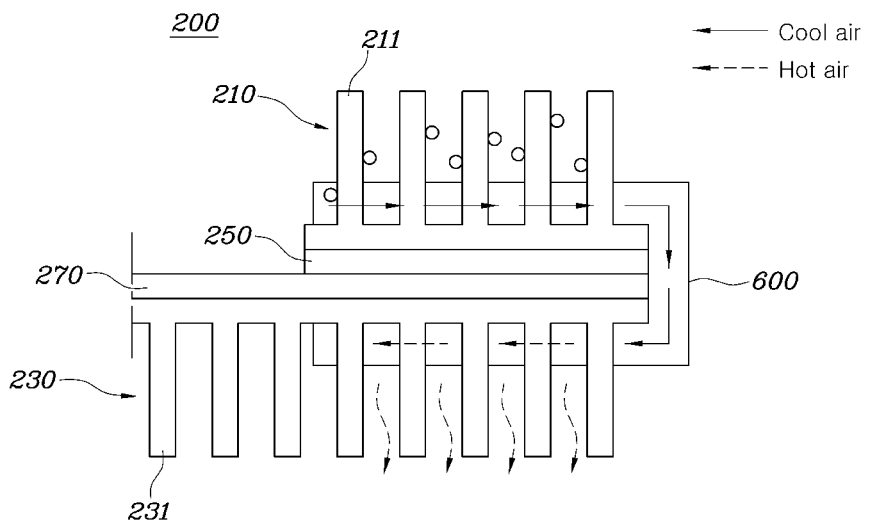
FIGS. 7 to 11 are views showing embodiments in which a moisture absorbing material is further provided to FIG. 2.

Accordingly, FIG. 7 shows fifth to sixth embodiments of the thermoelectric air-conditioning part 200 according to the present invention, wherein the moisture absorbing material 600 is further provided to the first or the fourth embodiment shown in FIG. 3 or FIG. 6. (FIG. 7 shows that the heat pipe 270 is installed, however, the heat pipe 270 may be installed or omitted.)

As such, the area in which the heat dissipating fins 231 of the heat dissipation unit 230 are installed is larger than the area in which the cooling fins 211 of the cooling unit 210 are installed, the number of the heat dissipating fins 231 is larger than the cooling fins 211, the heat pipe 270 is installed at the portion where the heat dissipating fins 231 are provided, and the moisture absorbing material 600 is provided at the cooling unit 210 and the heat dissipation unit 230 and is configured to connect the cooling unit 210 and the heat dissipation unit 230. Accordingly, when air introduced through the blower 300 passes the thermoelectric air conditioning unit 200, the heat dissipating fins 231 act as a resistor and thus the resistance to airflow in the heat dissipation unit 230 can be increased, heat exchange can be performed by the heat pipe 270, and condensation water formed in the cooling unit 210 is absorbed and moved to the heat dissipating fins 231 of the heat dissipation unit 230 by the moisture absorbing material 600. Thus, by increasing both the area and the resistance to airflow of the heat dissipation unit 230 while the amount of air flowing to the cooling unit 210 is increased more than that flowing to the heat dissipation unit 230, and by obtaining the cooling effect of evaporation created when condensation water moved to the heat dissipation unit 230 is evaporated by the heat dissipating fins 231, the cooling effect for the thermoelectric air-conditioning part 200 can be increased and thus more cooling air can be provided to the user H.

Figure 8:
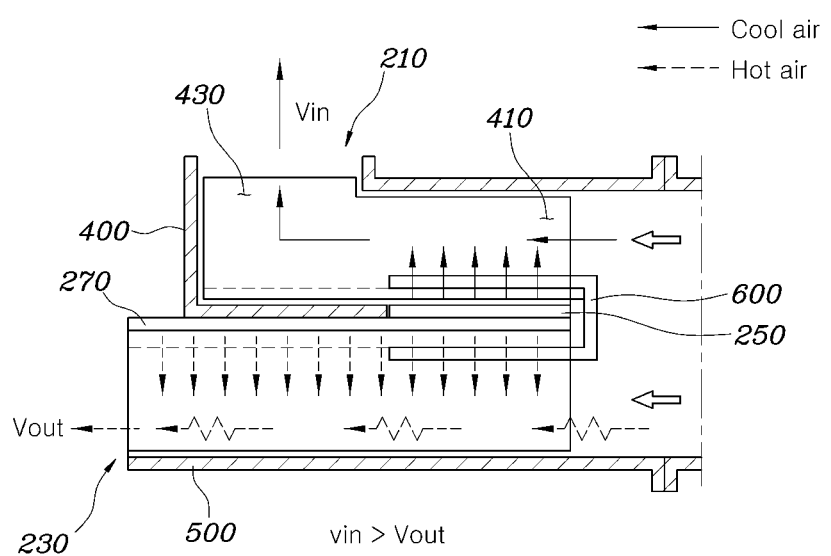
Figure 9:
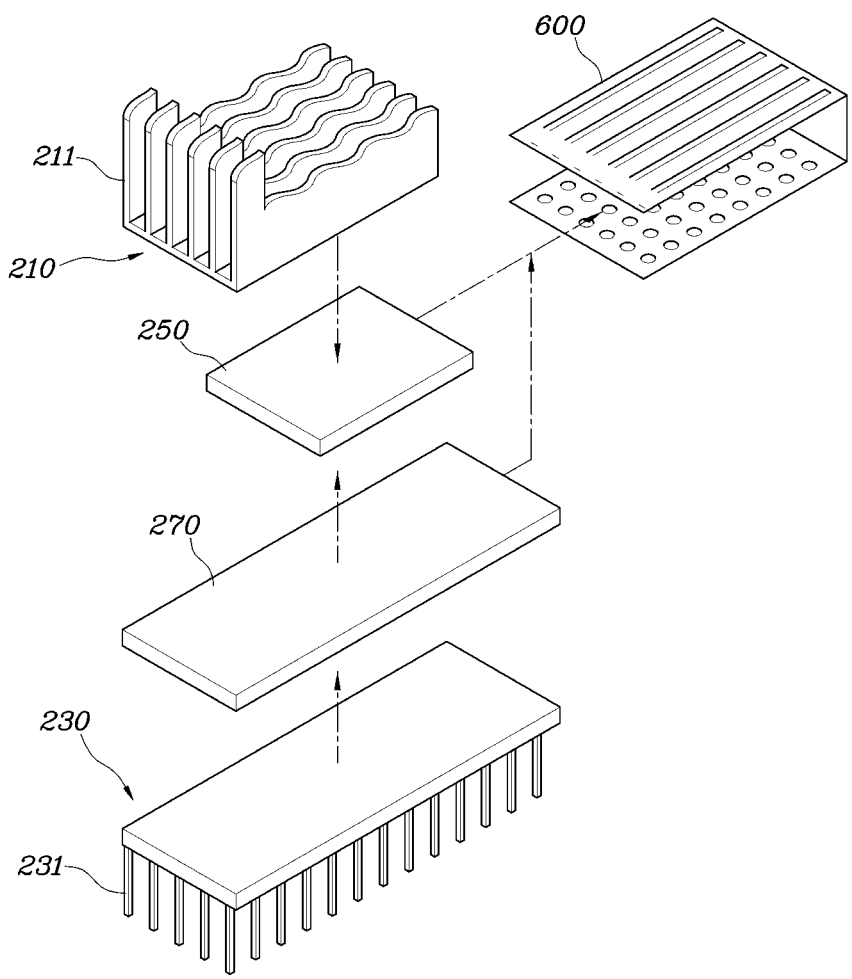
Figure 10:
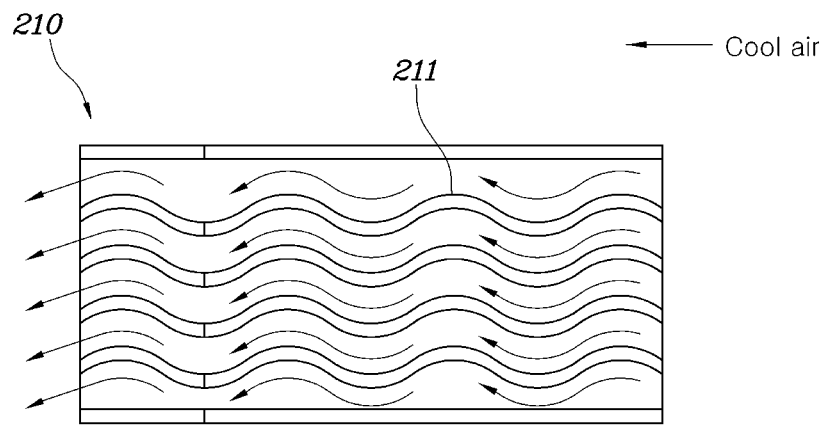

FIGS. 8 to 10 show a seventh embodiment of the thermoelectric air-conditioning part 200 of the present invention, which is similar to the fourth embodiment of FIG. 6. However, in the case of the seventh embodiment, the cooling fin 211 of the cooling unit 210 is provided by being bent a plurality of times in a streamlined-shape such that the cooling unit 210 has a wave-shaped path in which air flows from an inlet to an outlet (FIG. 10). In addition, a lateral cross-section of the cooling fin 211 is formed such that a first side thereof is higher than a second side thereof so as to correspond to a shape of the cool air duct 400. Here, the first side may be the inlet 410 side, and the second side may be the outlet 430 side. At this time, the heat dissipating fin 231 of the heat dissipation unit 230 is provided such that a plurality of the heat dissipating fins 231 having a small area is provided at a predetermined interval. Accordingly, when air introduced through the blower 300 passes through the thermoelectric air-conditioning part 200, in the cooling unit 210, air is guided in accordance with a shape of the cooling fin 211 to be able to easily flow, and in the heat dissipation unit 230, the heat dissipating fin 231 acts as the resistor, thereby increasing the resistance to airflow in the heat dissipation unit 230 and thus the amount of air flowing to the cooling unit 210 is increased more than that flowing to the heat dissipation unit 230. In addition, the heat pipe 270 is provided between the cooling unit 210 and the heat dissipation unit 230, and both the area and the resistance to airflow of the heat dissipation unit 230 is increased, whereby the cooling effect for the thermoelectric air-conditioning part 200 can be increased and thus more cooling air can be provided to the user H.

Figure 11:
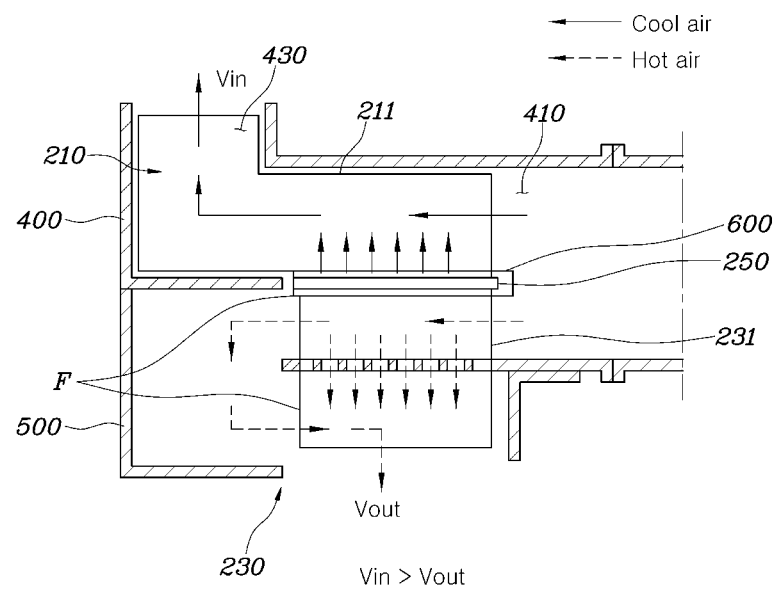

FIG. 11 shows an eighth embodiment of the thermoelectric air-conditioning part 200 according to the present invention, in which the moisture absorbing material 600 is further provided to the third embodiment including the heat dissipation unit 230 comprised of a plurality of layers F shown in FIG. 5. Accordingly, as in the third embodiment, the heat dissipating fins 231 combined with the heat dissipation unit 230 of the thermoelectric air-conditioning part 200 are provided to be stacked in one or more layers F, and the moisture absorbing material 600 is configured to connect the cooling unit 210 and the heat dissipation unit 230. Thus, air introduced to the heat dissipation unit 230 passes through the one layer F formed by stacking the heat dissipating fins 231 and then passes through the remaining layer F, whereby the resistance to airflow introduced through the blower 300 is increased and thus airflow in the cooling unit 210 is increased. At the same time, condensation water moved from the cooling unit 210 to the heat dissipation unit 230 is evaporated by the heat dissipating fins 231, thereby obtaining the cooling effect of evaporation in such a manner that the cooling effect for the thermoelectric air-conditioning part 200 can be increased to provide more cooling air to the user H. In particular, the total length b in which the heat dissipating fins 231 are installed may be set to be 1.5 times longer than the total length a in which the cooling fins 211 are installed.

Thus, according to the ventilation module for the ventilation seat according to the above-described embodiments of the present invention, a cooling efficiency equation is used in which the temperature difference between the cooling unit 210 and the heat dissipation unit 230 is increased by further providing the heat pipe 270 and the moisture absorbing material 600, the area of the heat dissipation unit 230 is larger than that of the cooling unit 210, and the resistance to airflow flowing to the heat dissipation unit 230 is increased so that the amount of airflow flowing to the cooling unit 210 is increased more than that flowing to the heat dissipation unit 230. Thus, the amount of heat dissipation is increased, whereby more pleasant cooling air can be provided to the user H.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A ventilation module for a ventilation seat for a vehicle, the module comprising:
   a thermoelectric air-conditioning part having a thermoelectric unit performing heat absorption and heat generation by using a Peltier effect when electric power is applied, a cooling unit provided at a first side of the thermoelectric unit, and a heat dissipation unit provided at a second side of the thermoelectric unit;
   a cool air duct, the cooling unit being located in the cool air duct, wherein the module is configured so that air that is supplied from a blower is cooled by the thermoelectric air-conditioning part, passes through a cooling fin of the cooling unit, and is discharged to an interior of the vehicle through a seat cushion; and
   a heat dissipation path, the heat dissipation unit being located in the heat dissipation path, wherein the module is configured so that air that is supplied from the blower is heated by the thermoelectric air-conditioning part, passes through a heat dissipating fin of the heat dissipation unit, and is discharged through the heat dissipation path;
   wherein the heat dissipating fin combined with the heat dissipation unit of the thermoelectric air-conditioning part is provided by being stacked in one or more layers;
   wherein the heat dissipating path is configured to divide the stacked heat dissipating fin into a first portion and a second portion in a direction perpendicular to a length of the stacked heat dissipating fin;
   wherein the heat dissipating path is configured to guide air such that the air is introduced to the heat dissipating unit by passing through the first portion of the stacked heat dissipating fin and then is curved to pass through the second portion of the stacked heat dissipating fin; and
   wherein by increasing a resistance to airflow in the heat dissipation unit more than that in the cooling unit, an amount of airflow flowing to the cooling unit is increased more than that flowing to the heat dissipation unit.

2. The module of claim 1, wherein an area in which the heat dissipating fin is installed is larger than an area in which the cooling fin is installed.

3. The module of claim 1, wherein an area in which the heat dissipating fin is installed is larger than an area in which the cooling fin is installed so that the resistance to airflow in the heat dissipation unit is increased and thus the amount of airflow in the cooling unit is increased.

4. The module of claim 1, wherein the heat dissipating fin is provided in a zigzag shape by being bent a predetermined number of times.

5. The module of claim 1, wherein the heat dissipating fin is provided in a zigzag shape by being bent a predetermined number of times, so that the resistance to airflow in the heat dissipation unit is increased and thus the amount of airflow in the cooling unit is increased.

6. The module of claim 1, wherein the heat dissipating fin combined with the heat dissipation unit of the thermoelectric air-conditioning part is provided by being stacked in a plurality of layers, so that air introduced to the heat dissipation unit passes through one layer and then passes through a remaining layer, so that the resistance to airflow in the heat dissipation unit is increased and thus the amount of airflow in the cooling unit is increased.

7. The module of claim 1, wherein the cooling fin of the cooling unit is provided by being bent a plurality of times in a streamlined-shape such that the cooling unit has a wave-shaped path in which air flows from an inlet to an outlet.

8. The module of claim 1, wherein a lateral cross-section of the cooling fin is formed such that a first side thereof is higher than a second side thereof so as to correspond to a shape of the cool air duct.

9. The module of claim 1, wherein the thermoelectric air-conditioning part is provided with a moisture absorbing material that can absorb condensation water of the cooling unit.

10. The module of claim 1, further comprising a moisture absorbing material at the cooling unit and the heat dissipation unit, the moisture absorbing material configured to connect the cooling unit and the heat dissipation unit to each other, such that condensation water of the cooling unit is absorbed and moved to the heat dissipation unit by the moisture absorbing material, thereby increasing a cooling effect for the heat dissipation unit, and the condensation water moved to the heat dissipation unit is evaporated, thereby obtaining a cooling effect of evaporation.

11. A seat for a vehicle, the seat comprising:
   a seat back;
   a seat cushion adjacent the seat back;
   a blower;
   a thermoelectric unit configured to perform heat absorption and heat generation by using a Peltier effect when electric power is applied;
   a cool air duct;
   a cooling unit located in the cool air duct and at a first side of the thermoelectric unit, the cooling unit having a cooling fin;
   a heat dissipation path; and
   a heat dissipation unit a heat dissipation path and at a second side of the thermoelectric unit;
   wherein the seat is configured so that air that is supplied from the blower is cooled by the thermoelectric unit, passes through the cooling fin, and is discharged through the seat cushion;
   wherein the seat is configured so that the air that is supplied from the blower is heated by the thermoelectric unit, passes through a heat dissipating fin of the heat dissipation unit, and is discharged through the heat dissipation path;

wherein the heat dissipating fin and the heat dissipation unit are stacked in one or more layers;

wherein the heat dissipating path is configured to divide the stacked heat dissipating fin into a first portion and a second portion in a direction perpendicular to a length of the stacked heat dissipating fin;

wherein the heat dissipating path is configured to guide air such that the air is introduced to the heat dissipating unit by passing through the first portion of the stacked heat dissipating fin and then is curved to pass through the second portion of the stacked heat dissipating fin; and wherein a resistance to airflow in the heat dissipation unit is greater than a resistance to air flow in the cooling unit.

12. The seat of claim 11, wherein an area in which the heat dissipating fin is installed is larger than an area in which the cooling fin is installed.

13. The seat of claim 11, wherein the heat dissipating fin is provided in a zigzag shape by being bent a predetermined number of times.

14. The seat of claim 11, wherein the heat dissipating fin and the heat dissipation unit are stacked in a plurality of layers.

15. The seat of claim 14, wherein air introduced to the heat dissipation unit can pass through one layer and then pass through a remaining layer.

16. The seat of claim 11, wherein the cooling fin is bent a plurality of times in a streamlined-shape.

17. The seat of claim 16, wherein the cooling unit has a wave-shaped path in which air can flow from an inlet to an outlet.

18. The seat of claim 11, wherein a lateral cross-section of the cooling fin is formed such that a first side thereof is higher than a second side thereof so as to correspond to a shape of the cool air duct.

19. The seat of claim 11, further comprising a moisture absorbing material at the cooling unit and the heat dissipation unit.

20. A ventilation module for a ventilation seat for a vehicle, the module comprising:

a thermoelectric air-conditioning part having a thermoelectric unit performing heat absorption and heat generation by using a Peltier effect when electric power is applied, a cooling unit provided at a first side of the thermoelectric unit, and a heat dissipation unit provided at a second side of the thermoelectric unit;

a cool air duct, the cooling unit being located in the cool air duct, wherein the module is configured so that air that is supplied from a blower is cooled by the thermoelectric air-conditioning part, passes through a cooling fin of the cooling unit, and is discharged to an interior of the vehicle through a seat cushion; and a heat dissipation path, the heat dissipation unit being located in the heat dissipation path, wherein the module is configured so that air that is supplied from the blower is heated by the thermoelectric air-conditioning part, passes through a heat dissipating fin of the heat dissipation unit, and is discharged through the heat dissipation path;

wherein the heat dissipating fin combined with the heat dissipation unit of the thermoelectric air-conditioning part is provided by being stacked in a plurality of layers so that air introduced to the heat dissipation unit can pass through one layer and then pass through a remaining layer;

wherein the heat dissipating path is configured to divide the stacked heat dissipating fin into a first portion and a second portion in a direction perpendicular to a length of the stacked heat dissipating fin;

wherein the heat dissipating path is configured to guide air such that the air is introduced to the heat dissipating unit by passing through the first portion of the stacked heat dissipating fin and then is curved to pass through the second portion of the stacked heat dissipating fin; and wherein by increasing a resistance to airflow in the heat dissipation unit more than that in the cooling unit, an amount of airflow flowing to the cooling unit is increased more than that flowing to the heat dissipation unit.

* * * * *